United States Patent
Yang et al.

(10) Patent No.: US 11,762,516 B2
(45) Date of Patent: Sep. 19, 2023

(54) DISPLAY DEVICE WITH TOUCH SENSING UNIT

(71) Applicant: SAMSUNG DISPLAY CO., LTD., Yongin-si (KR)

(72) Inventors: Sung Jin Yang, Cheonan-si (KR); Hwan Hee Jeong, Cheonan-si (KR); Young Hyun Kim, Suwon-si (KR); Ma Eum Cho, Seongnam-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 97 days.

(21) Appl. No.: 17/407,963

(22) Filed: Aug. 20, 2021

(65) Prior Publication Data

US 2022/0083173 A1 Mar. 17, 2022

(30) Foreign Application Priority Data

Sep. 16, 2020 (KR) ........................ 10-2020-0118864

(51) Int. Cl.
*G06F 3/044* (2006.01)
*G06F 3/041* (2006.01)
*H10K 50/842* (2023.01)
*H10K 59/12* (2023.01)

(52) U.S. Cl.
CPC .......... *G06F 3/0446* (2019.05); *G06F 3/0443* (2019.05); *G06F 3/04164* (2019.05); *G06F 2203/04107* (2013.01); *G06F 2203/04112* (2013.01); *H10K 50/8426* (2023.02); *H10K 59/12* (2023.02)

(58) Field of Classification Search
CPC .. G06F 3/0446; G06F 3/0443; G06F 3/04164; G06F 2203/04112; G06F 3/0448
See application file for complete search history.

(56) References Cited

U.S. PATENT DOCUMENTS

| | | | |
|---|---|---|---|
| 9,329,737 B2* | 5/2016 | Lee ........................ | G06F 3/0446 |
| 9,891,764 B2* | 2/2018 | Song ..................... | G06F 3/0446 |
| 10,359,896 B2* | 7/2019 | Iwami ................... | G06F 3/0445 |
| 10,996,782 B2* | 5/2021 | Park ....................... | H04N 7/181 |
| 2009/0194344 A1* | 8/2009 | Harley .................. | G06F 3/0446 |
| | | | 178/18.06 |

(Continued)

FOREIGN PATENT DOCUMENTS

| KR | 10-1082293 | 11/2011 |
|---|---|---|
| KR | 10-1976089 | 5/2019 |

*Primary Examiner* — Amy Onyekaba
(74) *Attorney, Agent, or Firm* — F. Chau & Associates, LLC

(57) ABSTRACT

A display device is provided. A display device includes a display unit, and a touch sensing unit disposed on the display unit, wherein the touch sensing unit includes a substrate, a first sensing electrode disposed on the substrate, wherein the first sensing electrode includes a plurality of touch conductive patterns separated from each other, a second sensing electrode disposed on the same layer as the first sensing electrode and insulated from the first sensing electrode, and a connection electrode electrically connecting the touch conductive patterns to each other, wherein the connection electrode includes a first connection electrode overlapping the second sensing electrode and a second connection electrode not overlapping the second sensing electrode.

18 Claims, 14 Drawing Sheets

(56) References Cited

U.S. PATENT DOCUMENTS

| | | | | |
|---|---|---|---|---|
| 2014/0210784 A1* | 7/2014 | Gourevitch | ........... | G06F 3/0443 |
| | | | | 345/174 |
| 2015/0185917 A1* | 7/2015 | Song | ...................... | G06F 3/0446 |
| | | | | 427/79 |
| 2015/0370375 A1* | 12/2015 | Hayashi | ................ | G06F 3/0445 |
| | | | | 216/13 |
| 2016/0197610 A1* | 7/2016 | Lee | ....................... | G06F 3/0443 |
| | | | | 345/174 |
| 2017/0031490 A1* | 2/2017 | Hashida | ................ | G06F 3/0445 |
| 2017/0205918 A1* | 7/2017 | Kim | ....................... | G06F 3/0443 |
| 2018/0190723 A1* | 7/2018 | Han | ....................... | G06F 3/0412 |
| 2018/0348937 A1* | 12/2018 | Pak | ....................... | G06F 3/0446 |
| 2019/0004638 A1* | 1/2019 | Lee | ....................... | G06F 3/0412 |
| 2019/0258338 A1* | 8/2019 | Park | ....................... | G06F 3/0412 |
| 2019/0369810 A1* | 12/2019 | Shi | ......................... | G06F 3/0443 |
| 2019/0369811 A1* | 12/2019 | Hsu | ....................... | G06F 3/0445 |
| 2020/0089384 A1* | 3/2020 | Wang | ................... | G06F 3/04164 |
| 2020/0159369 A1* | 5/2020 | Seo | ....................... | H10K 59/131 |
| 2020/0285348 A1* | 9/2020 | Nakayama | ........... | G06F 3/0446 |
| 2021/0397305 A1* | 12/2021 | Cho | ....................... | G06F 3/0446 |
| 2022/0069027 A1* | 3/2022 | Wang | ................... | G09G 3/2003 |
| 2022/0113838 A1* | 4/2022 | Xu | ......................... | G06F 3/0446 |

* cited by examiner

TE: TCP

DISPLAY DEVICE WITH TOUCH SENSING UNIT

CROSS REFERENCE TO RELATED APPLICATION

This application claims priority under 35 U.S.C. § 119 to Korean Patent Application No. 10-2020-0118864 filed on Sep. 16, 2020 in the Korean Intellectual Property Office, the disclosure of which is incorporated by reference herein in its entirety.

TECHNICAL FIELD

The present invention relates to a display device. More particularly, the present invention relates to a display device having increased reliability.

DISCUSSION OF THE RELATED ART

Display devices have been increasingly used in different electronic devices. For example, display devices are applied to various electronic appliances such as smart phones, digital cameras, notebook computers, navigators, and smart televisions.

Recently, in the fields of smart phones or tablet PCs, touch sensing units that recognize a touch input have been used. The touch sensing unit determines whether a user inputs a touch, and calculates the corresponding position as touch input coordinates. The touch sensing unit may include a driving electrode and a sensing electrode. In some cases, the arrangement and positions of the electrodes may impact the sensitivity, accuracy, and reliability of the touch input in the display device, as well as the luminance of light emitted from the display.

SUMMARY

Aspects of the present inventive concepts provide for a display device capable of preventing a short between a sensing electrode and a connection electrode for connecting adjacent driving electrodes and increasing touch sensitivity.

However, aspects of the present inventive concepts are not restricted to those set forth herein. The above and other aspects of the present inventive concepts will become more apparent to one of ordinary skill in the art to which the present invention pertains by referencing the detailed description thereof given below.

An embodiment of a display device includes a display unit, and a touch sensing unit disposed on the display unit, wherein the touch sensing unit includes a substrate, a first sensing electrode disposed on the substrate that includes a plurality of touch conductive patterns separated from each other, a second sensing electrode disposed on the same layer as the first sensing electrode and insulated from the first sensing electrode, and a connection electrode electrically connecting the separated touch conductive patterns, wherein the connection electrode includes a first connection electrode overlapping the second sensing electrode and a second connection electrode not overlapping the second sensing electrode.

An embodiment of a display device includes a display unit, and a touch sensing unit disposed on the display unit, wherein the touch sensing unit includes a substrate, a plurality of first sensing electrodes disposed on the substrate and extending in a first direction, a plurality of second sensing electrodes disposed on the same layer as the plurality of first sensing electrodes and extending in a second direction perpendicular to the first direction, and a connection electrode electrically connecting both ends of the first sensing electrode, wherein the connection electrode includes a first connection electrode disposed in a region where the first sensing electrode intersects the second sensing electrode, and a second connection electrode disposed between the second sensing electrodes adjacent to each other.

BRIEF DESCRIPTION OF THE DRAWINGS

The above and other aspects and features of the present inventive concepts will become more apparent by describing in detail exemplary embodiments thereof with reference to the attached drawings, in which.

DETAILED DESCRIPTION OF THE EMBODIMENTS

The present invention will now be described more fully hereinafter with reference to the accompanying drawings, in which embodiments of the invention are shown. This invention may, however, be embodied in different forms and should not necessarily be construed as limited to the embodiments set forth herein. Rather, these embodiments are provided so that this disclosure will be thorough and complete, and will fully convey the scope of the invention to those skilled in the art.

It will also be understood that when a layer is referred to as being "on" another layer or substrate, the layer may be directly on the other layer or substrate, or intervening layers may also be present. The same reference numbers may indicate the same components throughout the specification. In the attached figures, the thickness of layers and regions may be exaggerated for clarity.

Although the terms "first", "second", etc. may be used herein to describe various elements, these elements, should not be limited by these terms. These terms may be used to distinguish one element from another element. Thus, a first element discussed below may be termed a second element without departing from teachings of one or more embodiments. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

Hereinafter, embodiments of the present invention will be described with reference to the attached drawings.

Figure 1:
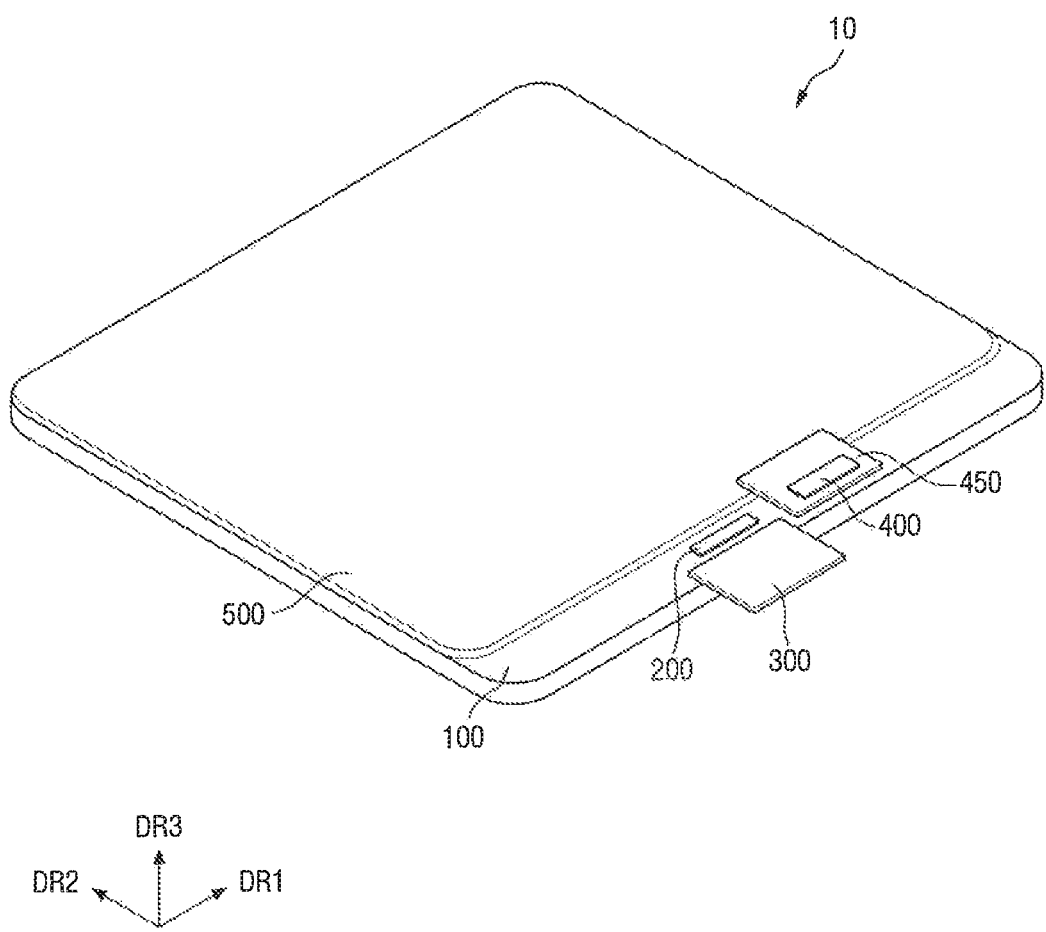
FIG. 1 is a plan layout view of a display device according to an embodiment.

FIG. 1 is a plan layout view of a display device according to an embodiment.

Referring to FIG. 1, a display device 10 configured to display a moving image or a still image may be used as a display screen of various products such as televisions, notebooks, monitors, billboards, internet of things (IOTs) as well as portable electronic appliances such as mobile phones, smart phones, tablet personal computers (tablet PCs), smart watches, watch phones, mobile communication terminals, electronic notebooks, electronic books, portable multimedia players (PMPs), navigators, and ultra mobile PCs (UMPCs).

The display device 10 may have a planar shape similar to a square in a plan view. For example, the display device 10 may have a rectangular shape having long sides extending in the first direction DR1 and short sides extending in the second direction DR2. The edge where the long side in the first direction DR1 meets the short side in the second direction DR2 may be rounded to a predetermined curvature or may be formed at a right angle. The planar shape of the display device 10 is not limited to a rectangle, and may be formed similar to other polygons, a circle, or an ellipse.

The display device 10 may include a display unit 100, a display driver 200, a display circuit board 300, a touch driver 400, a touch circuit board 450, and a touch sensing unit 500.

The display unit 100 may include a display area including pixels for displaying an image, and a non-display area disposed around the display area. In the display area of the display unit 100, light may be emitted from a plurality of light emitting areas (or a plurality of opening areas). For example, the display unit 100 may include a pixel circuit such as a switching element, a pixel defining layer defining a light emitting area of the display area, and a self-light emitting element.

For example, an organic light emitting display panel may be applied as the display unit 100. The following embodiments illustrate an organic light emitting display panel applied as the display unit 100, but the present invention is not necessarily limited thereto, and different kinds of display panels such as a liquid crystal display (LCD) panel, a quantum dot organic light emitting display (QD-OLED) panel, a quantum dot liquid crystal display (QD-LCD) panel, a quantum nano light emitting display panel (nano NED), and a micro light emitting diode (LED) may be applied.

The display driver 200 may output signals and voltages for driving the display unit 100. The display driver 200 may supply data voltages to data lines. The display driver 200 may supply a power voltage to a power line and may supply scan control signals to a scan driver. The display driver 200 may include an integrated circuit (IC), and may be attached onto the display unit 100 by a chip on glass (COG) method, a chip on plastic (COP) method, or an ultrasonic bonding method.

The display circuit board 300 may be attached onto a display pad portion of the display unit 100. The display circuit board 300 may be attached onto the display unit 100 using an anisotropic conductive film (ACF). Thus, lead lines of the display circuit board 300 may be electrically connected to the display pad portion of the display unit 100. The display circuit board 300 may include a flexible printed circuit board, a printed circuit board, or a flexible film such as a chip on film.

The touch driver 400 may be connected to a touch electrode or a sensing electrode of the touch sensing unit 500. The touch driver 400 may apply a touch driving signal to the sensing electrode of the touch sensing unit 500 and measure a capacitance value of the sensing electrode. For example, the touch driving signal may include a signal having a plurality of driving pulses. The touch driver 400 not only determines whether a touch is input based on the capacitance value of the sensing electrode, but also calculates touch coordinates of the touch input. The touch driver 400 may include an integrated circuit (IC) and mounted on the touch circuit board 450.

The touch circuit board 450 may be attached on a touch pad portion of the touch sensing unit 500 using an anisotropic conductive film. Thus, lead lines of the touch circuit board 450 may be electrically connected to the touch pad portion of the touch sensing unit 500. The touch circuit board 450 may include a flexible printed circuit board, a printed circuit board, or a flexible film such as a chip on film.

The touch sensing unit 500 may be disposed on the display unit 100. The planar shape of the touch sensing unit 500 may correspond to the planar shape of the display unit 100, but the present invention is not limited thereto. The touch sensing unit 500 may be flat, but is not necessarily limited thereto, and may include curved portions formed at left and right ends thereof. In this case, the curved portion may have a constant curvature or a variable curvature. Further, like the display unit 100, the touch sensing unit 500 may be flexibly formed, so that it may be warped, bent, folded, or rolled.

The touch sensing unit 500 may include a touch electrode or sensing electrode disposed in a touch sensor area to sense a user's touch, and a touch pad portion disposed in a touch peripheral area surrounding the touch sensor area. The touch pad portion may be formed on the touch sensing unit 500 at one edge of the touch sensing unit 500 and electrically connected to the touch circuit board 450.

Although it is illustrated in FIG. 1 that the touch sensing unit 500 is a separate touch panel from the display unit 100, the present invention is not limited thereto. For example, the touch sensing unit 500 may be formed integrally with the display unit 100 by being disposed on a thin film encapsulation layer that encapsulates a light emitting element layer of the display unit 100.

Figure 2:
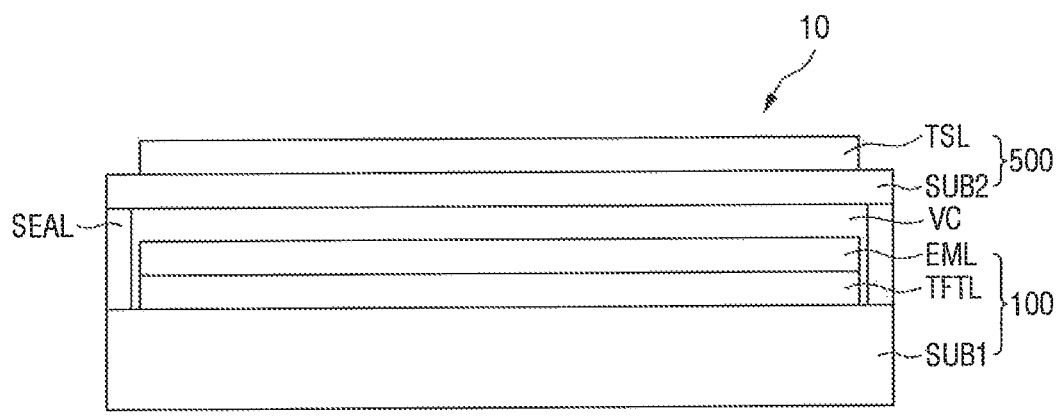
FIG. 2 is a cross-sectional view of a display device according to an embodiment.

FIG. 2 is a cross-sectional view of a display device according to an embodiment.

Referring to FIG. 2, the display unit 100 may include a first substrate SUB1, a thin film transistor layer TFTL, and a light emitting element layer EML.

The first substrate SUB1 may be a base substrate or a base member, and may include an insulating material such as a polymer resin. For example, the first substrate SUB1 may be a rigid substrate. In another example, the first substrate SUB1 may be a flexible substrate capable of bending, folding, rolling, or the like. When the first substrate SUB1 is a flexible substrate, it may be include polyimide (PI), but the material thereof is not limited thereto.

The thin film transistor layer TFTL may be disposed on the first substrate SUB1. The thin film transistor layer TFTL may include scan lines, data lines, power lines, and scan control lines, data connection lines connecting the display driver 200 and the data lines together, and pad connection lines connecting the display driving unit 200 and the display pad unit to each other as well as thin film transistors constituting a pixel circuit of pixels. Each of the thin film transistors may include a gate electrode, a semiconductor layer, a source electrode, and a drain electrode. For example, when the scan driver is formed on one side of the non-display area NDA of the display unit 100, the scan driver may include thin film transistors.

The thin film transistor layer TFTL may be disposed in the display area and the non-display area. The thin film transistors, scan lines, data lines, and power lines of each of the pixels of the thin film transistor layer TFTL may be disposed in the display area DA. The scan control lines, data connection lines, power supply lines, and pad connection lines of the thin film transistor layer TFTL may be disposed in the non-display area.

The light emitting element layer EML may be disposed on the thin film transistor layer TFTL. The light emitting element layer EML may include pixels in which a first electrode, a light emitting layer, and a second electrode are sequentially stacked to emit light, and a pixel defining layer. The pixels of the light emitting device layer EML may be disposed in the display area DA.

For example, the light emitting layer may be an organic light emitting layer including an organic material. The light emitting layer may include a hole transporting layer, an organic light emitting layer, and an electron transporting layer. When the first electrode receives a predetermined voltage through the thin film transistor of the thin film transistor layer TFTL and the second electrode receives a cathode voltage, holes and electrons may be transferred to the organic light emitting layer through the hole transport layer and the electron transport layer, respectively, and the layers may be combined with each other in the organic light emitting layer to emit light. For example, the first electrode may be an anode electrode, and the second electrode may be a cathode electrode.

In another example, the light emitting element layer EML may include at least one of a quantum dot light emitting diode, an inorganic material-based micro light emitting diode (for example, Micro LED), and an inorganic material-based nano light emitting diode (for example, Nano LED).

An air gap VC may be disposed between the display unit 100 and the touch sensing unit 500. In the process of attaching the display unit 100 and the touch sensing unit 500 to each other through an adhesive member SEAL, the air gap VC may be formed between the display unit 100 and the touch sensing unit 500. However, the present invention is not necessarily limited thereto, and a filling layer may be disposed between the display unit 100 and the touch sensing unit 500. In the process of attaching the display unit 100 and the touch sensing unit 500 to each other through an adhesive member SEAL, the filling layer may be interposed between the display unit 100 and the touch sensing unit 500. The filling layer may be an epoxy filling film or a silicone filling film, but is not necessarily limited thereto.

The touch sensing unit 500 may include a second substrate SUB2 and a touch sensor layer TSL.

The second substrate SUB2 may support the touch sensor layer TSL disposed thereon. The second substrate SUB2 may encapsulate the thin film transistor layer TFTL and the light emitting element layer EML disposed on the first substrate SUB1 together with the adhesive member SEAL. The second substrate SUB2 may be made of an insulating material such as a polymer resin. The second substrate SUB2 may be a rigid substrate. When the second substrate SUB2 is a rigid substrate, the second substrate SUB2 may include a glass material or a transparent metal material, but the material thereof is not limited thereto. The second substrate SUB2 may be a flexible substrate capable of bending, rolling, or the like.

The touch sensor layer TSL may be disposed on the second substrate SUB2. The touch sensor layer TSL may include a sensing electrode for sensing a user's touch, a touch pad portion, and touch signal lines (or sensing lines) connecting the touch pad portion and the sensing electrode to each other. For example, the touch sensor layer TSL may sense a user's touch using a self-capacitance method or a mutual capacitance method.

In another example, the touch sensor layer TSL may be directly disposed on an encapsulation layer of the display unit 100. In this case, the encapsulation layer of the display unit 100 may be a base member supporting the touch sensor layer TSL. Accordingly, the second substrate SUB2 supporting the touch sensor layer TSL may be omitted.

The sensing electrode of the touch sensor layer TSL may be disposed in the touch sensor area overlapping the display area of the display unit 100. The touch signal lines (or sensing lines) and touch pad portion of the touch sensor layer TSL may be disposed in the touch peripheral area overlapping the non-display area of the display unit 100.

An anti-reflection member and a cover window may be additionally disposed on the touch sensor layer TSL. The antireflection member may be disposed on the touch sensor layer TSL, and the cover window may be disposed on the antireflection member by an adhesive member.

The display device 10 may further include an adhesive member SEAL attaching the display unit 100 and the touch sensing unit 500 to each other.

The adhesive member SEAL may be interposed between the edge of the first substrate SUB1 and the edge of the second substrate SUB2 in the non-display area. The adhesive member SEAL may be disposed along the edges of the first substrate SUB1 and the second substrate SUB2 in the non-display area to seal the air gap VC. The first substrate SUB1 and the second substrate SUB2 may be coupled to each other through the adhesive member SEAL. For example, the adhesive member SEAL may be a frit adhesive layer, an ultraviolet curable resin, or a thermosetting resin, but it is not necessarily limited thereto.

Figure 3:
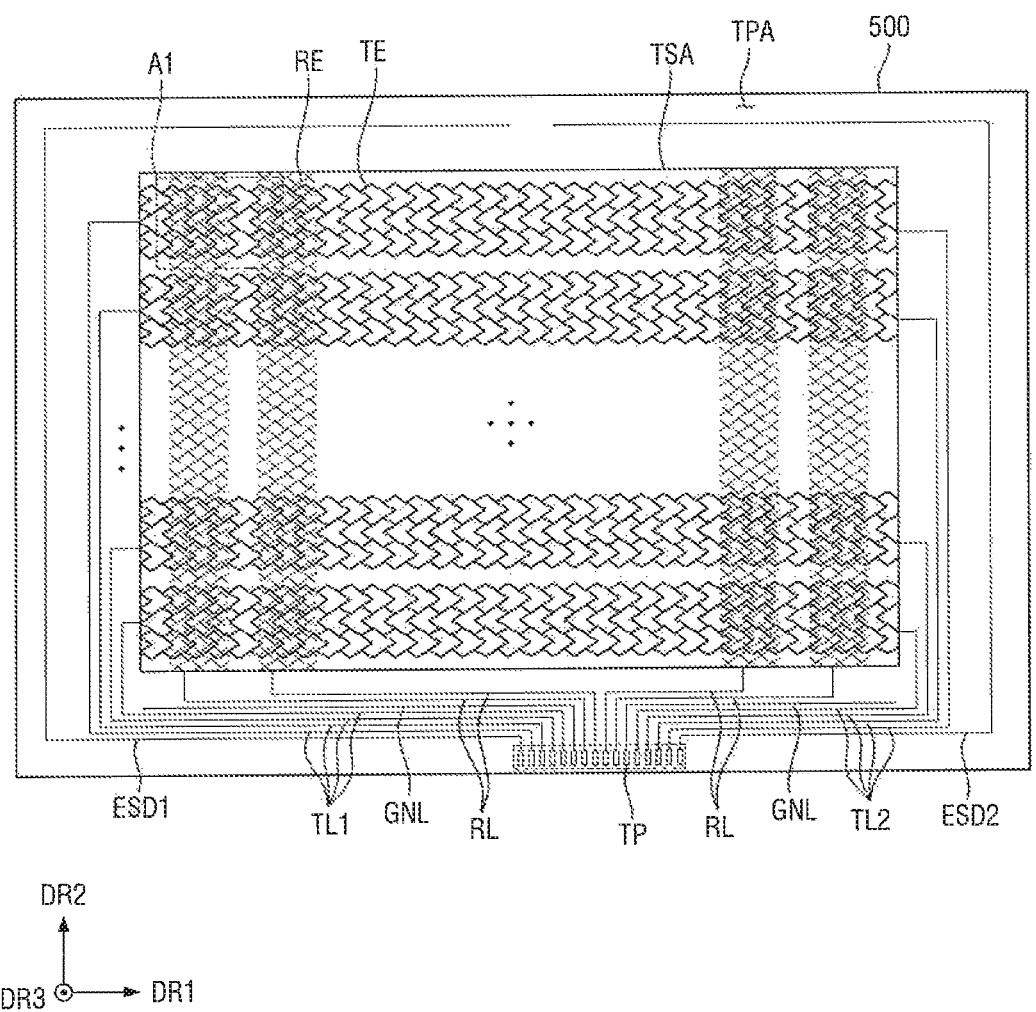
FIG. 3 is a plan view illustrating a touch sensing unit of a display device according to an embodiment.
Figure 4:
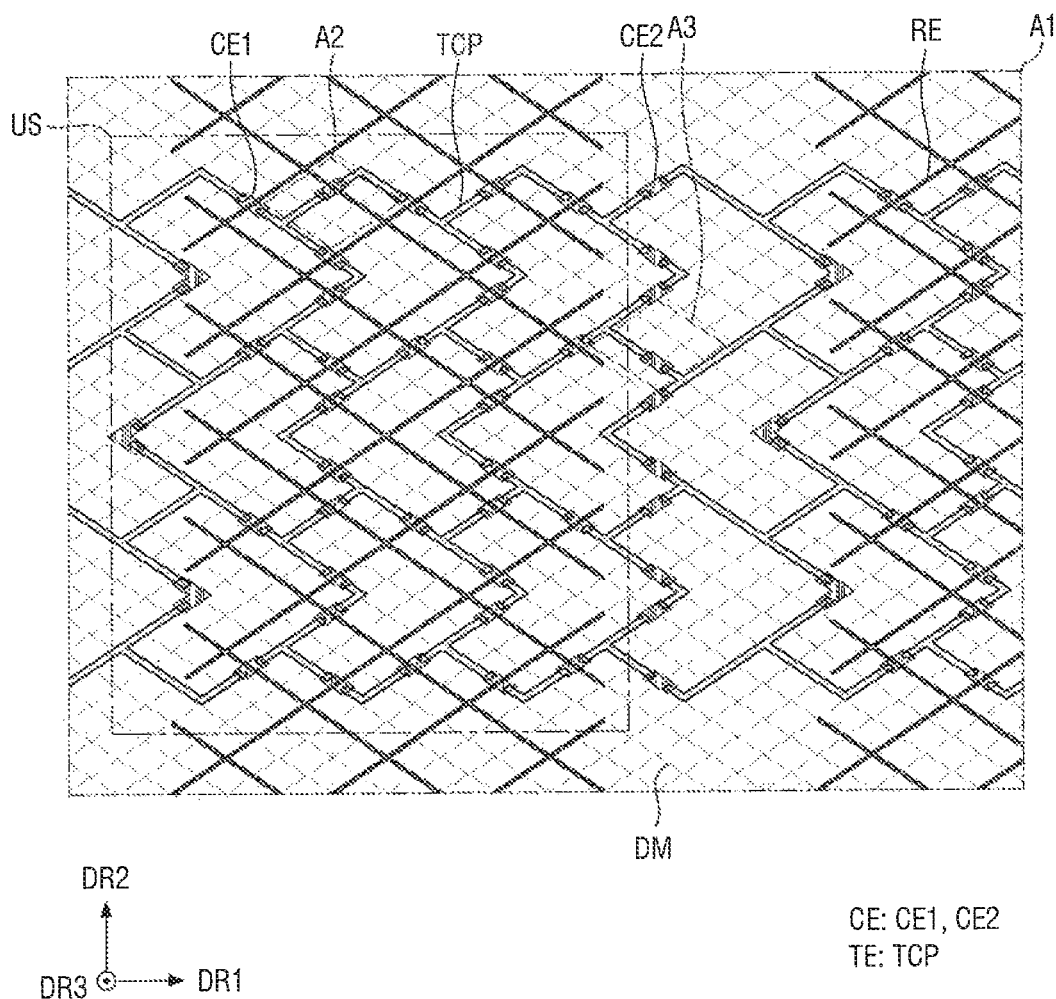
FIG. 4 is an enlarged view of the area A1 of FIG. 3.

FIG. 3 is a plan view illustrating a touch sensing unit of a display device according to an embodiment. FIG. 4 is an enlarged view of the area A1 of FIG. 3.

Referring to FIGS. 3 and 4, the touch sensing unit 500 may include a touch area TSA and a non-touch area TPA disposed around the touch area TSA. The touch area TSA may be configured to sense a user's touch. The touch area TSA may overlap the display area of the display unit 100, and the non-touch area TPA may overlap the non-display area of the display unit 100.

The touch sensing unit 500 may further include a plurality of first sensing electrodes and a plurality of second sensing electrodes. The plurality of first sensing electrodes and the plurality of second sensing electrodes may be arranged in the touch area TSA. The first sensing electrode may be a driving electrode TE, and may receive a touch driving signal from the touch driver 400. The second sensing electrode may be a sensing electrode RE, and the touch driver 400 may measure a change in mutual capacitance formed between the driving electrode TE and the sensing electrode RE. Hereinafter, the first sensing electrode is referred to as the driving electrode TE, and the second sensing electrode is referred to as the sensing electrode RE.

Each driving electrode of the plurality of driving electrodes TE may extend in the first direction DR1. The plurality of driving electrodes TE may be repeatedly spaced apart along the second direction DR2. The plurality of driving electrodes TE may be electrically insulated from each other. Each sensing electrode of the plurality of sensing electrodes RE may extend in the second direction DR2. The plurality of sensing electrodes RE may be repeatedly spaced apart along the first direction DR1. The plurality of sensing electrodes RE may be electrically insulated from each other.

The driving electrode TE extending in the first direction DR1 may intersect the sensing electrode RE extending in the second direction in at least one region. For example, the driving electrode TE may include a region intersecting the sensing electrode RE and a region not intersecting the sensing electrode RE. The non-intersecting region may include a region between two adjacent sensing electrodes RE.

The overall shape of each of the plurality of driving electrodes TE and the plurality of sensing electrodes RE in a plan view may have a mesh structure or a network structure. For example, the plurality of driving electrodes TE and the plurality of sensing electrodes RE may constitute a plurality of conductive patterns extending in a direction inclined with respect to the first direction DR1 and the second direction DR2, respectively. Accordingly, the plurality of driving electrodes TE and the plurality of sensing electrodes RE minimize an area overlapping the light emitting area of the display unit 100. Thus, the display device 10 may prevent a reduction in luminance of light emitted from the light emitting area of the display unit 100; For example, the conductive patterns in the touch sensing unit 500 may allow an increased luminance of light to emit from the light emitting area of the display unit 100.

The plurality of driving electrodes TE and the plurality of sensing electrodes RE may be formed on the same layer. In a region where the driving electrode TE intersects the sensing electrode RE, the driving electrodes TE may be separated and spaced apart from each other with the sensing electrode RE interposed therebetween. Accordingly, the driving electrode TE and the sensing electrode RE disposed on the same layer may be insulated from each other. Both ends of the driving electrode TE that are spaced apart from each other with the sensing electrode RE interposed therebetween may be electrically connected by a connection electrode CE.

For example, the plurality of sensing electrodes RE may be integrally formed (for example, the plurality of sensing electrodes RE may form a continuous piece), and each driving electrode in the plurality of driving electrodes TE may include a plurality of touch conductive patterns TCP separated and spaced from each other. The plurality of touch conductive patterns TCP may have different shapes from each other in a plan view. In the intersection region of the driving electrode TE and the sensing electrode RE, the touch conductive patterns TCP of the driving electrodes TE adjacent to each other may be spaced apart from each other with the sensing electrode RE interposed therebetween. The sensing electrode RE interposed between the conductive patterns TCP may interposed in a disconnected area of the conductive patterns TCP so as not to contact the conductive patterns TCP. Accordingly, the driving electrode TE may be insulated from the sensing electrode RE intersecting the driving electrode TE.

When the sensing electrodes RE include a mesh structure or a network structure in a plan view, a space may be located between the electrodes forming one sensing electrode RE, and the touch conductive pattern TCP of the driving electrode TE may be disposed in the space between the electrodes of the sensing electrode RE. For example, the driving electrode TE includes a plurality of touch conductive patterns TCP separated and spaced from each other, and in the region where the driving electrode TE intersects the sensing electrode RE, the sensing electrode RE may be disposed in the region (the disconnected area) between the touch conductive patterns TCP of the driving electrode TE separated from each other. In this case, the sensing electrode RE may be separated and spaced apart from the touch conductive pattern TCP, and the sensing electrode RE and the touch conductive pattern TCP may be insulated from each other. However, the present invention is not necessarily limited thereto. For example, the driving electrodes TE may be integrally formed, and the sensing electrode RE may include a plurality of touch conductive patterns separated and insulated from each other.

Further, the touch conductive pattern TCP of the driving electrode TE may be disposed between two sensing electrodes RE adjacent to each other. For example, a part of the touch conductive pattern TCP of the driving electrode TE may be disposed in a region that does not intersect the sensing electrode RE, and the region may include a region between two adjacent sensing electrodes RE. A plurality of touch conductive patterns TCP of the driving electrode may be provided between the two sensing electrodes RE adjacent to each other, and may be separated and spaced apart from each other.

The driving electrode TE disposed in a region between the two adjacent sensing electrodes RE includes a plurality of touch conductive patterns TCP, and the touch conductive patterns TCP disposed in the region are separated and spaced apart. Accordingly, it is possible to reduce a difference in a floating area in each of the touch conductive patterns TCP of the driving electrode TE.

For example, when the driving electrode TE includes a plurality of touch conductive patterns TCP separated and spaced apart from each other in the region between two sensing electrodes RE adjacent to and insulated from each other, and further includes the touch conductive patterns TCP in the region where the driving electrode TE intersects the sensing electrode RE, it is possible to reduce a difference in area between the touch conductive pattern TCP disposed in the region where the driving electrode TE intersects the sensing electrode RE and the touch conductive pattern TCP disposed in the region between two sensing electrodes RE adjacent to and insulated from each other. For example, when the driving electrode TE includes touch conductive patterns TCP in both above-described areas, the difference in size between both areas may be reduced. In this case, in the process of forming the driving electrode TE, it is possible to reduce a difference in area in which the touch conductive pattern TCP for each region of the driving electrode TE is floated.

Accordingly, the composition of the area of the touch conductive pattern TCP of the driving electrode TE in a plan view may be substantially uniform, regardless of the region intersecting the sensing electrode RE and the region not intersecting the sensing electrode RE. Accordingly, in the process of forming the driving electrode TE on the buffer layer BF, it is possible to reduce a difference in area of the touch conductive pattern TCP of the driving electrode TE in the region where the driving electrode TE intersects the sensing electrode RE and the region between two sensing electrodes RE adjacent to and insulated from each other.

As the difference in the area of the touch conductive pattern TCP of the driving electrode TE that may be floated decreases, it is possible to suppress or prevent film burst defects of the first insulating film IL1 that may occur due to a difference in the floating area of the touch conductive pattern TCP, and it is possible to suppress or prevent a short circuit between the connection electrode CE and the sensing electrode RE disposed on the first insulating layer IL1, even if static electricity is applied in the process of forming the touch sensing unit 500. Therefore, the reliability of the touch sensing unit 500 may be increased.

The touch conductive patterns TCP of the driving electrodes TE may be electrically connected by connection electrodes CE: CE1 and CE2. For example, even if the driving electrodes TE include touch conductive patterns TCP separated and spaced apart from each other, adjacent touch conductive patterns TCP may be electrically connected through connection electrodes CE: CE1 and CE2. Further, the driving electrodes TE including the plurality of touch conductive patterns TCP may be electrically connected to each other over the entire area. For example, the plurality of touch conductive patterns TCP may be electrically connected to each other over the touch area TSA.

The connection electrode CE may include a first connection electrode CE1 and a second connection electrode CE2. The first connection electrode CE1 may be disposed in the region where the driving electrode TE intersects the sensing electrode RE, and may overlap the sensing electrode RE in the thickness direction (third direction DR3). For example, the first connection electrode CE1 may from a bridge that crosses over the sensing electrode RE to connect a touch conductive pattern TCP. The second connection electrode CE2 may be disposed between the two adjacent sensing electrodes RE insulated from each other, and may not overlap the sensing electrode RE.

For example, the first connection electrode CE1 may be disposed in the region where the driving electrode TE intersects the sensing electrode RE, and may electrically connect the separated and spaced touch conductive patterns TCP with the sensing electrode RE therebetween. Accordingly, the first connection electrode CE1 may overlap the sensing electrode RE in the thickness direction (the third direction DR3). The second connection electrode CE2 may be disposed between two adjacent sensing electrodes RE, and may electrically connect the touch conductive patterns TCP disposed between the two sensing electrodes RE and separated from each other. Accordingly, the second connection electrode CE2 may not overlap the sensing electrode RE. A detailed stacked structure of the touch sensing unit 500 will be described later.

The two touch conductive patterns TCP connected by the second connection electrode CE2 may include a region where the touch conductive patterns TCP both extend in substantially the same direction, and each of the touch conductive patterns TCP may include ends TC facing each other. For example, the two touch conductive patterns TCP connected by the second connection electrode CE2 may both extend in the first direction DR1 from a portion connected to the second connection electrode CE2 by the second contact hole CNT2, or may alternatively both extend in the second direction DR2. Further, the second connection electrode CE2 may cover a driving electrode gap TGP between the ends TC.

Some of the second connection electrodes CE2 may electrically connect the touch conductive patterns TCP having ends not facing each other. For example, ends of the two touch conductive patterns TCP connected by the second connection electrode CE2 may not face each other, and the two touch conductive patterns TCP may extend in different directions from each other. For example, any one of the two touch conductive patterns TCP connected by some of the second connection electrodes CE2 may extend in the first direction DR1 from a portion connected to the second connection electrode CE2 by the second contact hole CNT2, and the other one thereof may extend in the second direction DR2.

As the second connection electrode CE2 is disposed between the two sensing electrodes RE, even if the driving electrode TE includes a plurality of touch conductive patterns TCP separated and spaced apart from each other between two adjacent sensing electrodes RE, the plurality of touch conductive patterns TCP may be electrically connected by the second connection electrode CE2.

The touch sensing unit 500 may further include a dummy pattern DM. The dummy pattern DM may be electrically insulated from separate electrodes and lines. The dummy pattern DM may be disposed between the plurality of driving electrodes TE, between the plurality of sensing electrodes RE, or between the driving electrode TE and the sensing electrode RE. The dummy pattern DM may be disposed on the same layer as the layer as the plurality of driving electrodes TE and the plurality of sensing electrodes RE, and may be insulated and spaced apart from each driving electrode TE and each sensing electrode RE.

The second connection electrode CE2 that connects touch patterns TCP may be disposed between the dummy patterns DM in a plan view. For example, the second connection electrode CE2 may be disposed between the ends DC of each of the dummy patterns DM spaced apart from each other in a plan view. However, the present invention is not limited thereto.

The dummy pattern DM may be electrically floated, and may adjust the basic capacitance of the touch area TSA. For example, since the touch sensing unit 500 may include the dummy pattern DM, the basic capacitance of the touch area TSA may be reduced, thereby increasing touch sensitivity.

The dummy pattern DM may be formed in a mesh structure or a network structure in a plan view. For example, the dummy pattern DM may include a plurality of electrodes extending in a direction inclined with respect to the first direction DR1 and the second direction DR2. Accordingly, the dummy pattern DM may minimize an area overlapping the light emitting area of the display unit 100, and accordingly may suppress or prevent a decrease in luminance of light emitted from the light emitting area of the display unit 100.

FIGS. 5 to 8 are further referred to describe the stacked structure of the driving electrode TE, the sensing electrode RE, the connection electrodes CE: CE1 and CE2, and the dummy pattern DM.

Figure 5:
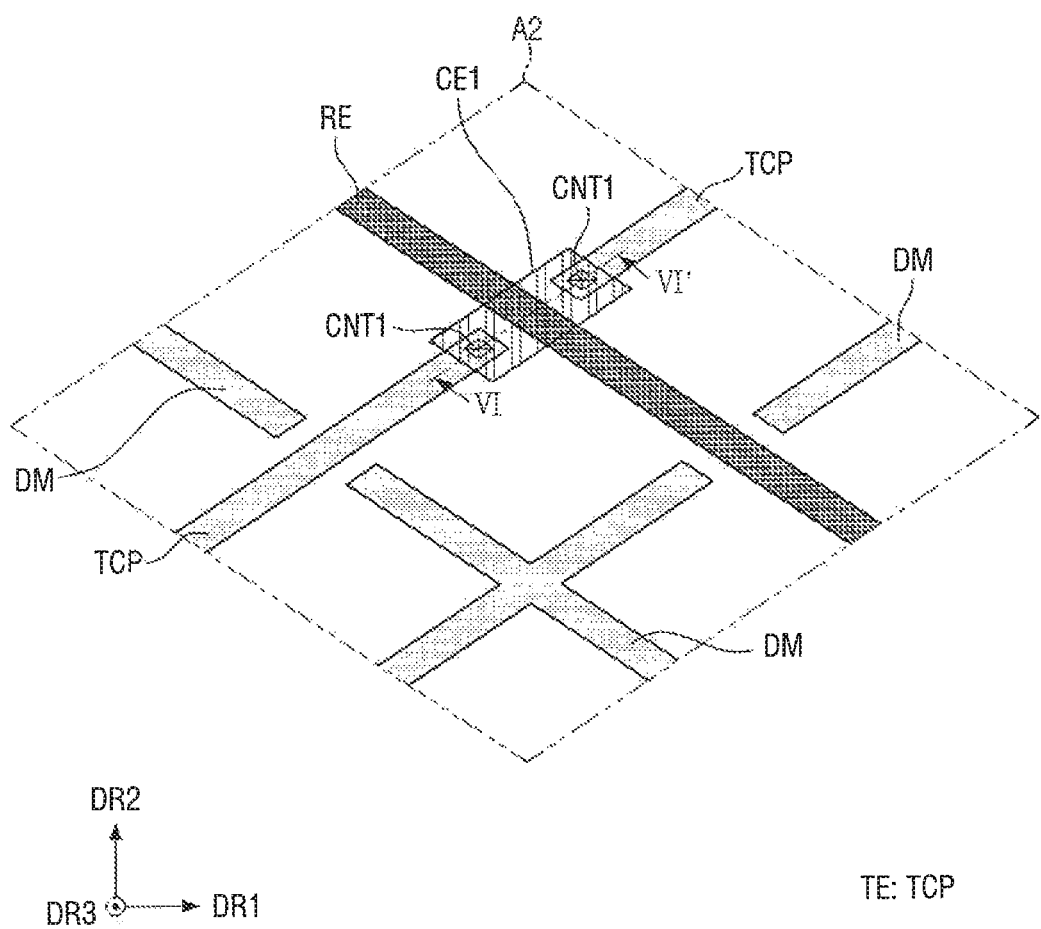
FIG. 5 is an enlarged plan view of the area A2 of FIG. 4.
Figure 6:
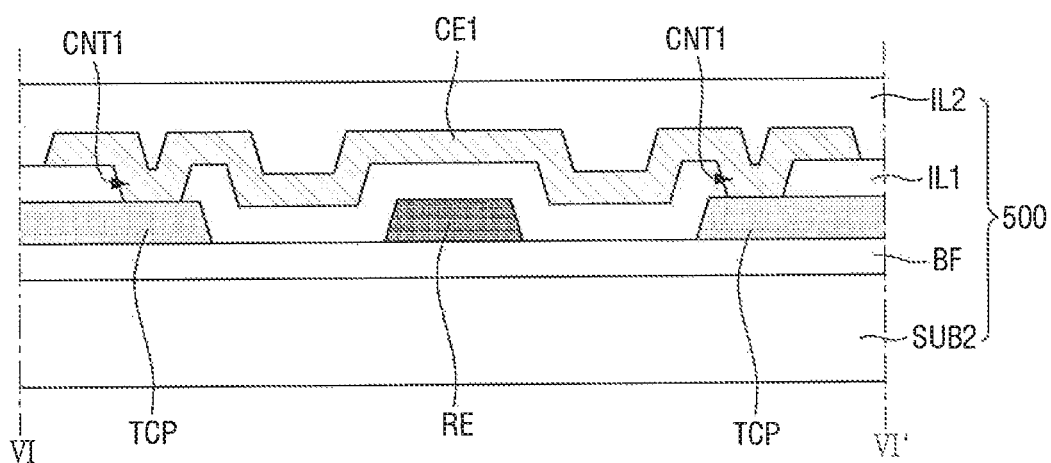
FIG. 6 is a cross-sectional view taken along the line VI-VI' of FIG. 5.
Figure 7:
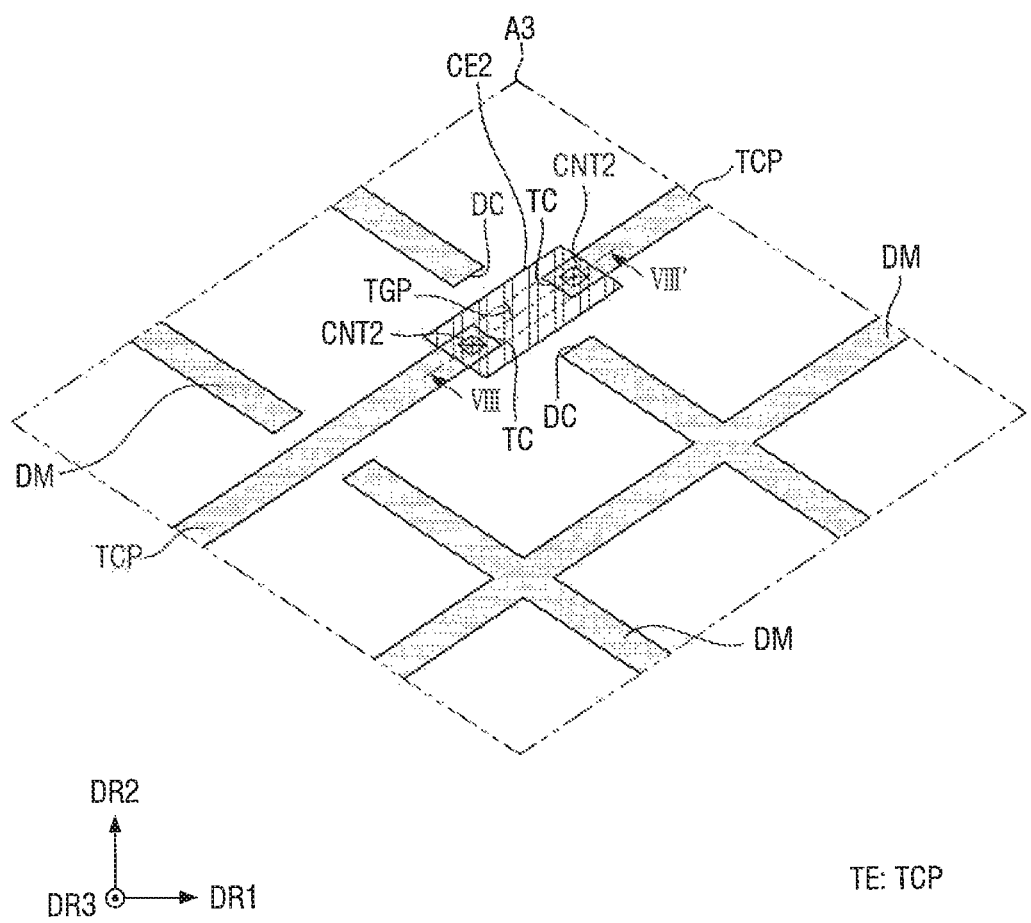
FIG. 7 is an enlarged plan view of the area A3 of FIG. 4.
Figure 8:
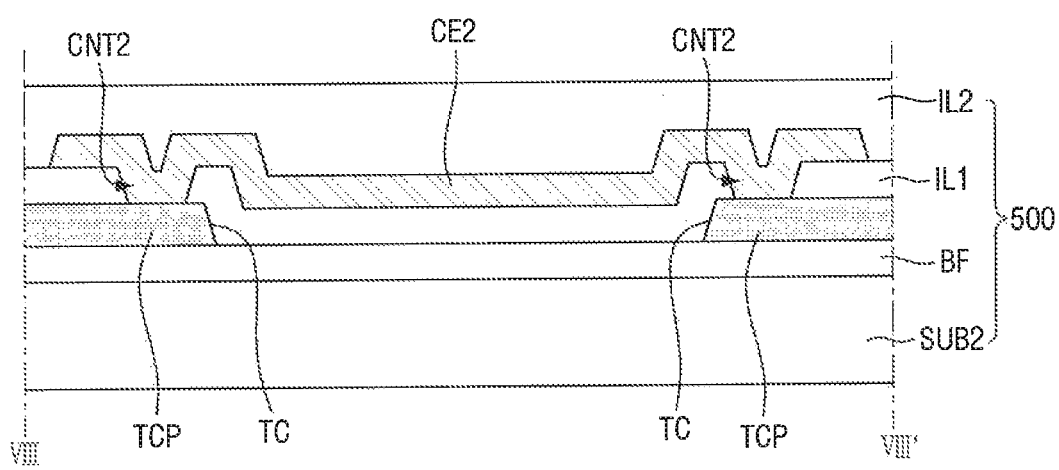
FIG. 8 is a cross-sectional view taken along the line VIII-VIII' of FIG. 7.

FIG. 5 is an enlarged plan view of the area A2 of FIG. 4, and FIG. 6 is a cross-sectional view taken along the line VI-VI' of FIG. 5. FIG. 7 is an enlarged plan view of the area A3 of FIG. 4, and FIG. 8 is a cross-sectional view taken along the line VIII-VIII' of FIG. 7.

Referring to FIGS. 5 to 8, the touch sensor layer TSL of the touch sensing unit 500 may include a conductive layer and an insulating layer disposed between the conductive layers. The touch sensor layer TSL may include a buffer layer BF, a plurality of driving electrodes TE, a plurality of sensing electrodes RE, a dummy pattern DM, a first insulating layer IL1, a connection electrode CE, and a second insulating layer IL2.

The buffer layer BF may be disposed on the second substrate SUB2. The buffer layer BF may prevent the penetration of air or moisture. The buffer layer BF may include an inorganic material. For example, the buffer layer BF may include a silicon nitride layer, a silicon oxynitride layer, a silicon oxide layer, a titanium oxide layer, an aluminum oxide layer, or a combination thereof. The buffer layer BF may be formed as multiple layers, but the present invention is not limited thereto. The buffer layer BF may be omitted.

The plurality of driving electrodes TE, the plurality of sensing electrodes RE, and the dummy pattern DM may be disposed on the buffer layer BF. The plurality of driving electrodes TE, the plurality of sensing electrodes RE, and the dummy pattern DM may be include the same material on the same layer. The plurality of driving electrodes TE, the plurality of sensing electrodes RE, and the dummy pattern DM may be insulated from each other by being spaced apart from each other. The plurality of driving electrodes TE, the plurality of sensing electrodes RE, and the dummy pattern DM may be formed as a single layer or multiple layers including at least one of molybdenum (Mo), molybdenum oxide (MoOx), molybdenum niobium (MoNb), molybdenum titanium (MoTi), an APC (Ag—Pd—Cu) alloy, nickel (Ni), and copper (Cu).

The first insulating layer IL1 may at least partially cover the plurality of driving electrodes TE, the plurality of sensing electrodes RE, and the dummy pattern DM, and may be disposed on the buffer layer BF. For example, the first insulating layer IL1 may be include an inorganic layer, for example, a silicon nitride layer, a silicon oxynitride layer, a silicon oxide layer, a titanium oxide layer, or an aluminum oxide layer.

The connection electrode CE may be disposed on the first insulating layer IL1. The first connection electrode CE1 may physically and/or electrically contact the touch conductive patterns TCP of the driving electrodes TE adjacent to each other through the first contact hole CNT1. The second connection electrode CE2 may physically and/or electrically contact the touch conductive patterns TCP of the driving electrodes TE adjacent to each other through the second contact hole CNT2. For example, the touch conductive patterns TCP adjacent to and separated from each other may be electrically connected through at least one of the first connection electrode CE1 and the second connection electrode CE2.

The connection electrode CE may be made of a different material than the plurality of driving electrodes TE, the plurality of sensing electrodes RE, and the dummy pattern DM. The connection electrode CE may include a transparent conductive material capable of transmitting light. For example, the connection electrode CE may include at least one of indium tin oxide (ITO), indium zinc oxide (IZO), and indium tin-zinc oxide (ITZO), but is not limited thereto.

The second insulating layer IL2 may cover the connection electrode CE, and may be disposed on the first insulating layer ILL. The second insulating layer IL2 may be include an inorganic layer, for example, a silicon nitride layer, a silicon oxynitride layer, a silicon oxide layer, a titanium oxide layer, or an aluminum oxide layer. The second insulating layer IL2 may planarize the upper end of the touch sensing unit 500.

Referring to FIGS. 3 and 4 again, the touch area TSA may include a plurality of unit sensors US. The unit sensor US may be disposed for each region where one driving electrode TE intersects one sensing electrode RE. For example, the unit sensor US may constitute a region where one driving electrode TE intersects one sensing electrode RE. The unit sensor US may be a minimum unit for sensing a touch input.

The touch sensing unit 500 may further include first and second driving lines TL1 and TL2, a sensing line RL, a ground line GNL, and first and second guard lines ESD1 and ESD2. The first and second driving lines TL1 and TL2, the sensing line RL, the ground line GNL, and the first and second guard lines ESD1 and ESD2 may be arranged in the non-touch area TPA.

One end of each of the first driving lines TL1 may be connected to the driving electrodes TE disposed at a first side of the touch area TSA. For example, one end of each of the first driving lines TL1 may be connected to the driving electrodes TE disposed at the left side of the touch area TSA. The other end of each of the first driving lines TL1 may be connected to some of the touch pad portions TP. The first driving lines TL1 may be connected to the touch pad portions TP disposed at the lower side of the non-touch area TPA via a first (e.g., left) side of the non-touch area TPA. Accordingly, the first driving lines TL1 may connect the driving electrodes TE disposed at the first (e.g., left) side of the touch area TSA to the touch pad portions TP.

One end of each of the second driving lines TL2 may be connected to the driving electrodes TE disposed at a second side of the touch area TSA opposite to one side of the touch area TSA. For example, one end of each of the second driving lines TL2 may be connected to the driving electrodes TE disposed at the right side of the touch area TSA. The other ends of the second driving lines TL2 may be connected to others of the touch pad portions TP. The second driving lines TL2 may be connected to the touch pad portions TP disposed at the lower side of the non-touch area TPA via the second side of the non-touch area opposite to one side of the non-touch area TPA. Accordingly, the second driving lines TL2 may connect the driving electrodes TE disposed at the second (e.g., right) side of the touch area TSA to the touch pad portions TP.

One end of each of the sensing lines RL may be connected to the sensing electrodes RE disposed at a third side of the touch area TSA adjacent to one side thereof or another side thereof. For example, one end of each of the sensing lines RL may be connected to some of the sensing electrodes RE disposed at the lower side of the touch area TSA. The other ends of the sensing lines RL may be connected to the touch pad portion TP. Accordingly, the sensing lines RL may connect the sensing electrodes RE disposed at the third (e.g., lower) side of the touch area TSA to the touch pad portions TP.

The touch pad portions TP may be disposed at one side of the second substrate SUB2. For example, the touch pad portion TP may be disposed at the lower side of the second substrate SUB2 or at the long edge of the second substrate SUB2. The touch circuit board 450 may be attached to the touch pad portions TP using an anisotropic conductive film. Accordingly, the touch pad portions TP may be electrically connected to the touch circuit board 450.

The ground line GNL may be disposed at one side of the non-touch area TPA where the touch pad portions TP are disposed. For example, the ground line GNL may be disposed between the sensing line RL and the first or second driving lines TL1 and TL2 at the lower side of the non-touch area TPA. One end of the ground line GNL may be connected to the touch pad portion TP, and the other end of the ground line GNL may extend between the sensing line RL and the first or second driving line TL1 or TL2, which are disposed adjacent to each other. The ground line GNL may be grounded with a specific voltage through the touch pad portion TP. Since the ground line GNL is grounded, interference between the sensing line RL and the first or second driving line TL1 or TL2 may be prevented.

The first guard line ESD1 may extend along an outer periphery of one side of the non-touch area TPA. For example, the first guard line ESD1 may be connected to the touch pad portion TP, and may extend along the lower edge, left edge, and upper edge of the non-touch area TPA from the touch pad portion TP. Since the first guard line ESD1 extends along the outer periphery of one side of the non-touch area TPA, static electricity applied from the outside may be extinguished. The first guard line ESD1 may prevent external static electricity from flowing into the touch sensing unit 500.

The second guard line ESD2 may extend along an outer periphery of the other side of the non-touch area TPA. For example, the second guard line ESD2 may be connected to the touch pad portion TP, and may extend along the lower edge, right edge, and upper edge of the non-touch area TPA from the touch pad portion TP. Since the second guard line ESD2 extends along the outer periphery of the other side of the non-touch area TPA, static electricity applied from the outside may be extinguished. The second guard line ESD2 may prevent external static electricity from flowing into the touch sensing unit 500.

Hereinafter, other embodiments will be described. In the following embodiments, redundant descriptions will be omitted or simplified for the same components as those previously described, and differences will be mainly described.

Figure 9:
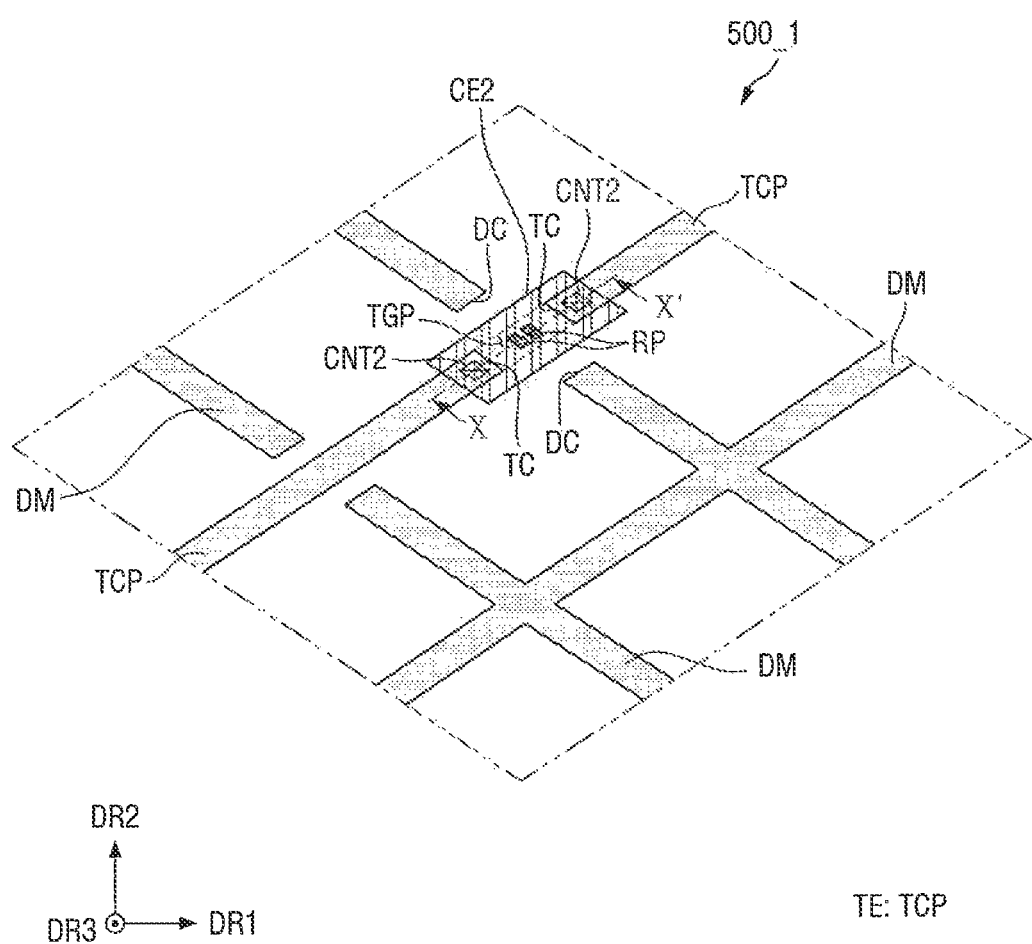
FIG. 9 is an enlarged plan view of a part of a touch sensing unit according to another embodiment.
Figure 10:
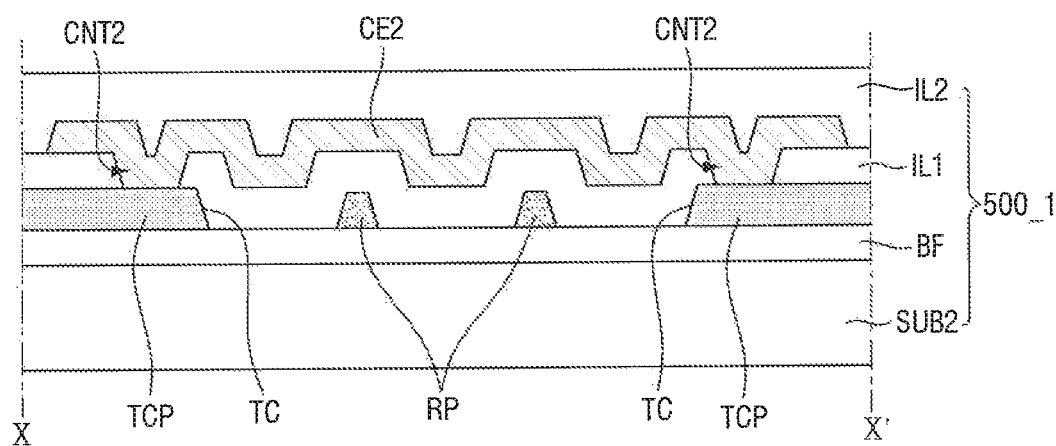
FIG. 10 is a cross-sectional view taken along the line X-X' of FIG. 9.

FIG. 9 is an enlarged plan view of a part of a touch sensing unit according to another embodiment. FIG. 10 is a cross-sectional view taken along the line X-X' of FIG. 9. FIG. 9 illustrates a vicinity of the second connection electrode CE2.

Referring to FIGS. 9 and 10, a touch sensing unit 500_1 according to the present embodiment is different from the touch sensing unit 500 according to the embodiment of FIGS. 7 and 8 in that it further includes a recognition pattern RP.

For example, the touch sensing unit 500_1 according to the present embodiment may further include a recognition pattern RP. The recognition pattern RP may be formed on the same layer as the driving electrode TE, the sensing electrode RE, and the dummy pattern DM. That is, the recognition pattern RP may be disposed on the buffer layer BF, and may be covered by the first insulating layer IL1.

The recognition pattern RP may be disposed between the ends TC of two adjacent touch conductive patterns TCP. The recognition pattern RP may be disposed between the ends DC of the dummy pattern DM, but the present invention is not necessarily limited thereto. The recognition pattern RP may overlap the second connection electrode CE2 in the thickness direction DR3. The recognition pattern RP may be disposed between two adjacent sensing electrodes RE, and may not be disposed in an area where the driving electrode TE intersects the sensing electrode RE, but the present invention is not limited thereto.

The recognition pattern RP may be formed in an island shape, and may be insulated from the driving electrode TE, the sensing electrode TE, and the dummy pattern DM. Moreover, the recognition pattern RP may be insulated from the connection electrodes CE: CE1 and CE2.

Although it is shown in FIGS. 9 and 10 that two recognition patterns RP are disposed between the ends TC of the touch conductive pattern TCP, the number of the recognition patterns RP disposed between the ends TC of the touch conductive pattern TCP is not limited thereto.

This embodiment of the present inventive concepts may suppress or prevent a film burst defect of the first insulating layer IL1 that may occur due to a difference in the floating area of the touch conductive pattern TCP, and thus the reliability of the touch detection unit 500_1 may be increased. Moreover, when a defect occurs, the recognition pattern RP will make it possible to determine whether a location where the defect occurs is a region where the driving electrode TE intersects the sensing electrode RE more quickly.

Figure 11:
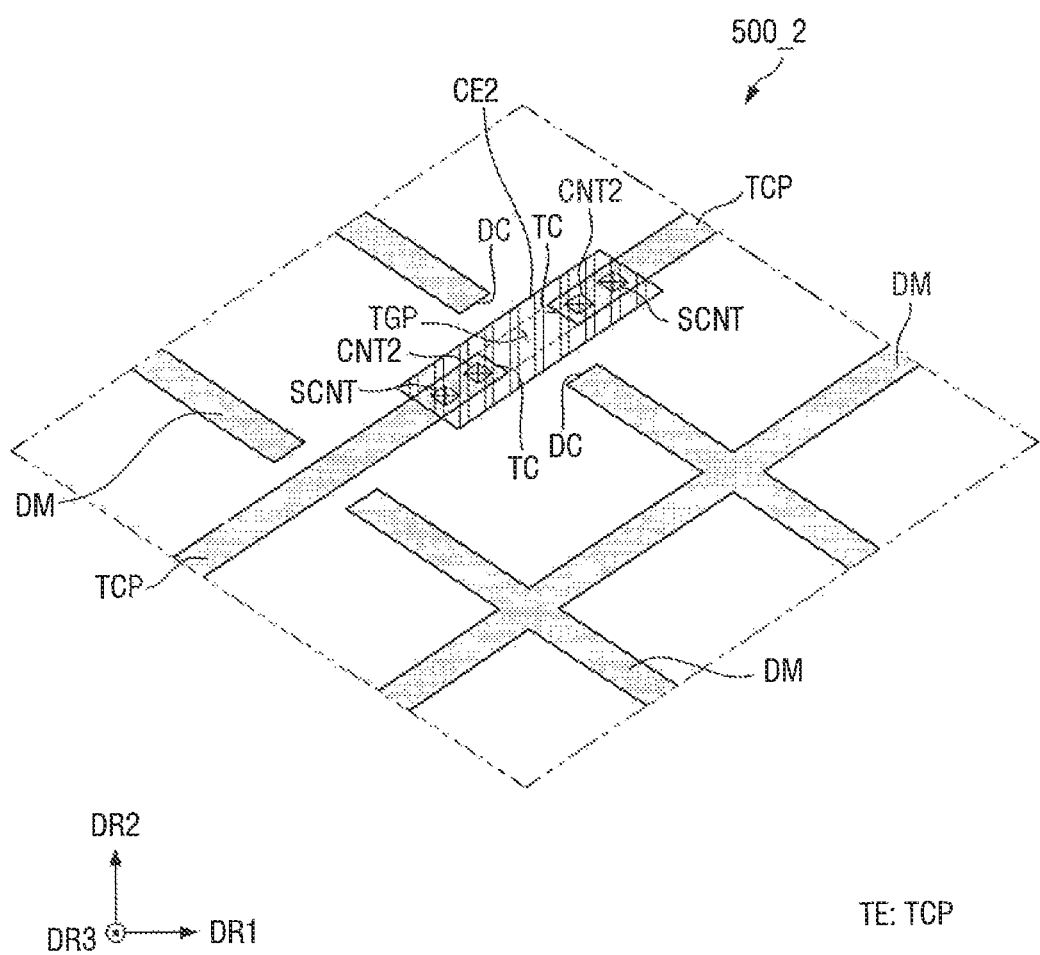
FIG. 11 is an enlarged plan view of a part of a touch sensing unit according to another embodiment.

FIG. 11 is an enlarged plan view of a part of a touch sensing unit according to another embodiment.

Referring to FIG. 11, a touch sensing unit 500_2 according to the present embodiment is different from the touch sensing unit 500 according to the embodiment of FIG. 7 in that it further includes a sub-contact hole SCNT for contacting the second connection electrode CE2 and the touch conduction pattern TCP.

For example, the touch sensing unit 500_2 according to the present embodiment may further include a sub-contact hole SCNT as well as the second contact hole CNT2. The second connection electrode CE2 may physically and/or electrically contact the touch conductive patterns TCP of the driving electrodes TE adjacent to each other through the sub-contact hole SCNT as well as the second contact hole CNT2.

This embodiment of the present inventive concepts may suppress or prevent a film burst defect of the first insulating layer IL1 that may occur due to a difference in the floating area of the touch conductive pattern TCP, and thus the reliability of the touch detection unit 500_2 may be increased. Moreover, as the touch sensing unit 500_2 further includes a sub-contact hole SCNT, it is possible to make the contact between the second connection electrode CE2 and the touch conductive pattern TCP more reliable.

Figure 12:
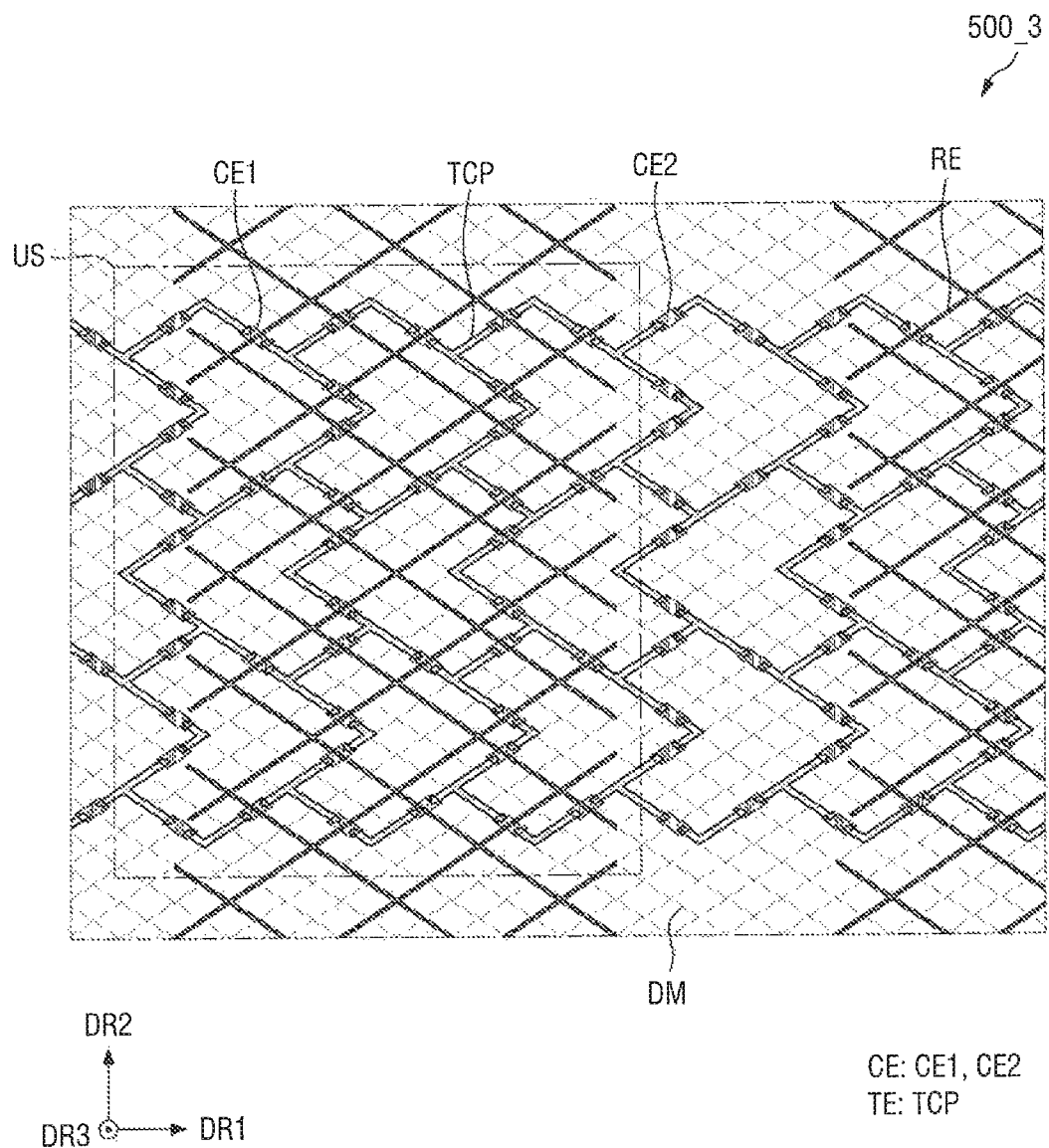
FIG. 12 is an enlarged plan view of a part of a touch sensing unit according to another embodiment.

FIG. 12 is an enlarged plan view of a part of a touch sensing unit according to still another embodiment.

Referring to FIG. 12, a touch sensing unit 500_3 according to the present embodiment is different from the touch sensing unit 500 according to the embodiment of FIG. 4 in that the arrangement of first connection electrodes CE1 in the touch sensing unit 500_3 is substantially the same as the arrangement of second connection electrodes CE2 in the touch sensing unit 500_3.

For example, the arrangement of the second connection electrodes CE2 in the region between the sensing electrodes RE in a plan view may be substantially the same as the arrangement of the first connection electrodes CE1 in the region where the driving electrode TE intersects the sensing electrode RE in a plan view. For example, the planar shape of each touch conductive pattern TCP of the driving electrode TE disposed in the region between the sensing electrodes RE may be substantially the same as the planar shape of each touch conductive pattern TCP of the driving electrode TE disposed in the region where the driving electrode TE intersects the sensing electrode RE.

This embodiment of the present inventive concepts may suppress or prevent a film burst defect of the first insulating layer IL1 that may occur due to a difference in the floating area of the touch conductive pattern TCP, and thus the reliability of the touch detection unit 500_3 may be increased. Moreover, since the planar shape of each touch conductive pattern TCP of the driving electrode TE disposed in the region between the sensing electrodes RE is substantially the same as the planar shape of each touch conductive pattern TCP of the driving electrode TE disposed in the region where the driving electrode TE intersects the sensing electrode RE, a difference in the floating area may be further reduced. Therefore, the reliability of the touch sensing unit 500_3 may be further increased.

Figure 13:
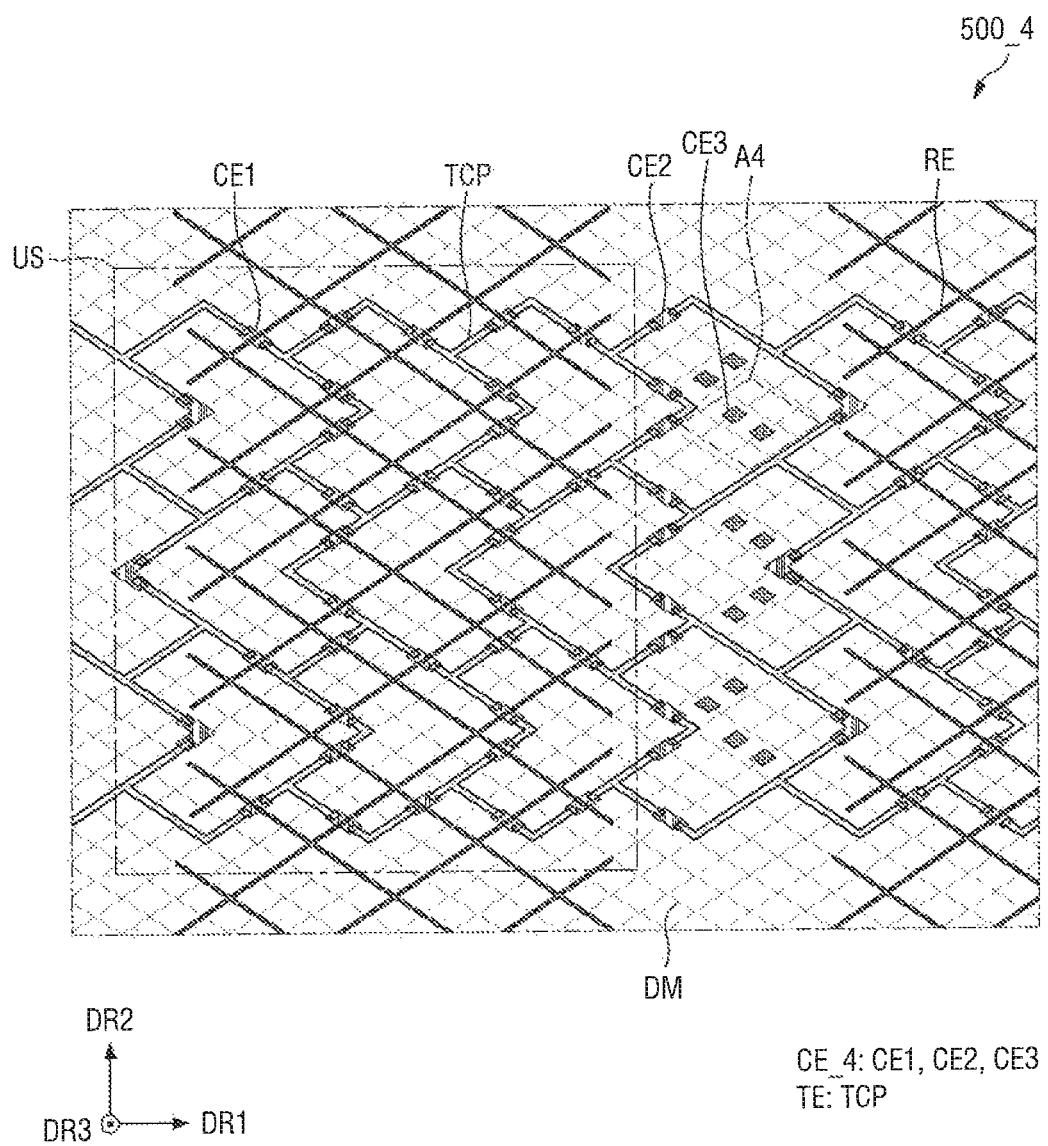
FIG. 13 is an enlarged plan view of a part of a touch sensing unit according to another embodiment.
Figure 14:
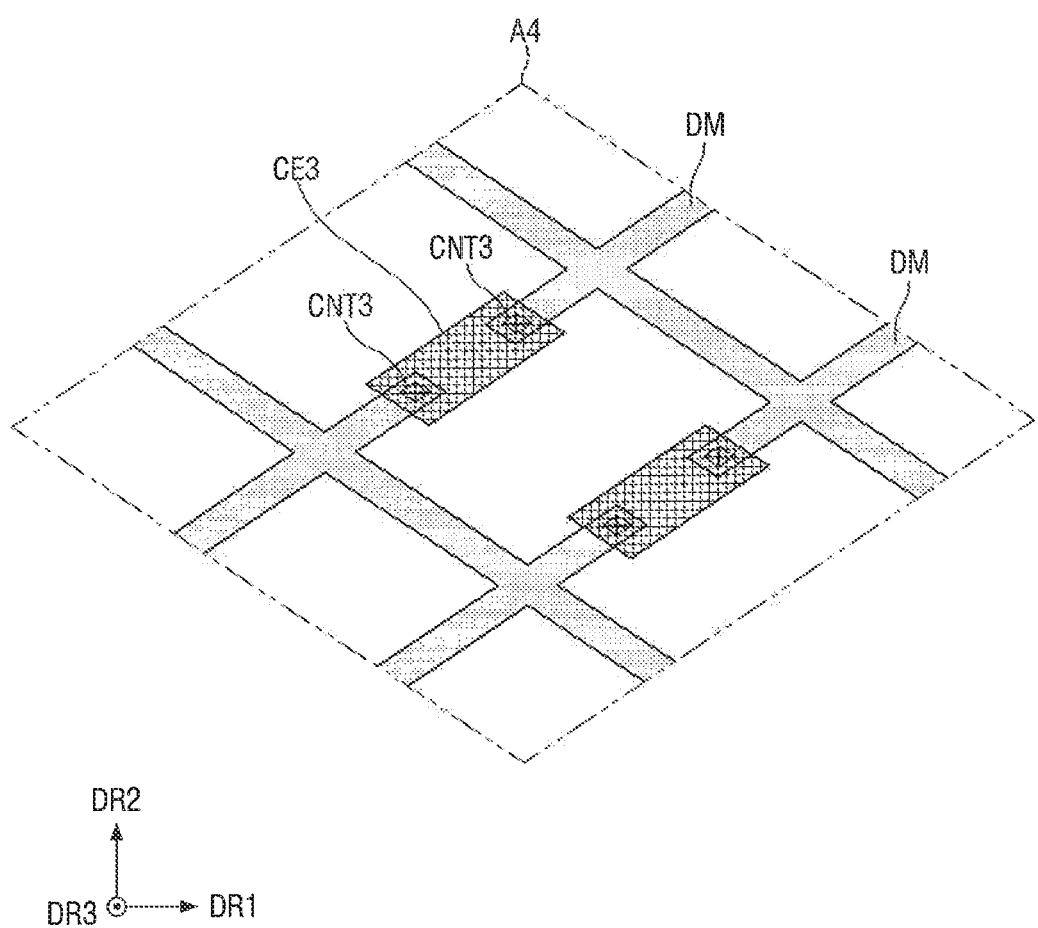
FIG. 14 is an enlarged view of the area A4 of FIG. 13.

FIG. 13 is an enlarged plan view of a part of a touch sensing unit according to still another embodiment. FIG. 14 is an enlarged view of the area A4 of FIG. 13.

Referring to FIGS. 13 and 14, a touch sensing unit 500_4 according to the present embodiment is different from the touch sensing unit 500 according to the embodiment of FIG. 4 in that dummy patterns DM adjacent to each other are electrically connected by a third connection electrode CE3.

For example, the connection electrode CE_4 according to the present embodiment may further include a third connection electrode CE3, and may electrically connect the dummy patterns DM adjacent to each other.

The third connection electrode CE3 may be disposed between adjacent sensing electrodes RE. The third connection electrode CE3 may not be disposed in the region where the driving electrode TE intersects the sensing electrode RE, but the present invention is not limited thereto. The third connection electrode CE3 may not overlap the driving voltage TE and the sensing electrode RE.

The third connection electrode CE3 may electrically connect the dummy patterns DM adjacent to each other. The third connection electrode CE3 may contact the dummy pattern DM through a third contact hole CNT3, and the dummy patterns DM adjacent to each other may be electrically connected to each other through the third connection electrode CE3. Accordingly, the planar area of each of the dummy patterns DM disposed between the sensing electrodes RE may become smaller.

This embodiment of the present inventive concepts may suppress or prevent a film burst defect of the first insulating layer IL1 that may occur due to a difference in the floating area of the touch conductive pattern TCP, and thus the reliability of the touch detection unit 500_4 may be increased. Moreover, in the process of manufacturing the display device 10, a difference in floating area between the dummy patterns DM separated from each other may be reduced. Accordingly, it is possible to suppress or prevent a film burst defect of the first insulating layer IL1, which may occur due to a difference in the floating area of the dummy pattern DM, so that the reliability of the touch sensing unit 500_4 may be further increased.

In concluding the detailed description, those skilled in the art will appreciate that many variations and modifications can be made to the embodiments without substantially departing from the principles of the present disclosure. Therefore, the disclosed embodiments of the inventive concepts are used in a generic and descriptive sense and not for purposes of limitation.

What is claimed is:

1. A display device, comprising:
a display unit; and
a touch sensing unit disposed on the display unit,
wherein thetouch sensing unit includes:
a substrate;
a first sensing electrode disposed on the substrate, wherein the first sensing electrode includes a plurality of touch conductive patterns separated from each other;
a second sensing electrode disposed on the same layer as the first sensing electrode and insulated from the first sensing electrode;
a connection electrode electrically connecting the touch conductive patterns to each other; and
a recognition pattern disposed between ends of the touch conductive patterns separated from each other,
wherein the connection electrode includes a first connection electrode overlapping the second sensing electrode and a second connection electrode not overlapping the second sensing electrode, and wherein the recognition pattern is insulated from the first sensing electrode, the second sensing electrode, and the connection electrode.

2. The display device of claim 1,
wherein a plurality of the second sensing electrodes is provided,
the first sensing electrode and the second sensing electrode intersect each other, and
the first connection electrode is disposed in a region where the first sensing electrode intersects the second sensing electrode, and the second connection electrode is disposed between adjacent second sensing electrodes.

3. The display device of claim 2,
wherein the first sensing electrode extends in a first direction,
the second sensing electrode extends in a second direction perpendicular to the first direction;
the first sensing electrode is a driving electrode; and
the second sensing electrode is a sensing electrode.

4. The display device of claim 1,
wherein the connection electrode covers a gap between two of the touch conductive patterns.

5. The display device of claim 1,
wherein the recognition pattern overlaps the second connection electrode.

6. The display device of claim 5, further comprising:
a dummy pattern disposed on the same layer as the first sensing electrode and the second sensing electrode, wherein the dummy pattern is separated and insulated from the first sensing electrode and the second sensing electrode; and
wherein the recognition pattern is disposed between ends of the dummy pattern.

7. The display device of claim 1, further comprising:
a dummy pattern disposed on the same layer as the first sensing electrode and the second sensing electrode, wherein the dummy pattern is separated and insulated from the first sensing electrode and the second sensing electrode,
wherein the second connection electrode is disposed between ends of the dummy pattern.

8. The display device of claim 1,
wherein the touch sensing unit further includes a touch area in which touch sensing is performed, and
the first connection electrode and the second connection electrode are disposed in the touch area.

9. The display device of claim 1,
wherein each of the first sensing electrode and the second sensing electrode include a mesh structure.

10. The display device of claim 1,
wherein the second sensing electrode is integrally formed.

11. A display device, comprising:
a display unit; and
a touch sensing unit disposed on the display unit,
wherein the touch sensing unit includes:
a substrate;
a first sensing electrode disposed on the substrate, wherein the first sensing electrode includes a plurality of touch conductive patterns separated from each other;
a second sensing electrode disposed on the same layer as the first sensing electrode and insulated from the first sensing electrode;
a connection electrode electrically connecting the touch conductive patterns to each other; and a plurality of dummy patterns disposed on the same layer as the first sensing electrode and the second sensing electrode, wherein the dummy patterns are separated and insulated from the first sensing electrode and the second sensing electrode, wherein the connection electrode includes a first connection electrode overlapping the second sensing electrode and a second connection electrode not overlapping the second sensing electrode, wherein the second connection electrode is disposed between ends of the dummy patterns, wherein the connection electrode further includes a third connection electrode electrically connecting the dummy patterns to each other, and wherein the third connection electrode does not overlap the first sensing electrode or the second sensing electrode.

12. The display device of claim 1, further comprising:
an insulating layer disposed between at least one of the touch conductive patterns and the second connection electrode,
wherein the at least one touch conductive pattern and the second connection electrode are in contact with each other through a contact hole penetrating the insulating layer that exposes at least a part of the second connection electrode.

13. The display device of claim 12, further comprising:
a sub-contact hole penetrating the insulating layer that exposes at least a part of the second connection electrode,
wherein the at least one touch conductive pattern and the second connection electrode are in contact with each other through the sub-contact hole.

14. A display device, comprising:
a display unit; and
a touch sensing unit disposed on the display unit,
wherein the touch sensing unit includes:
a substrate;
a plurality of first sensing electrodes disposed on the substrate and extending in a first direction;
a plurality of second sensing electrodes disposed on the same layer as the plurality of first sensing electrodes, wherein the second sensing electrodes extend in a second direction perpendicular to the first direction;
a connection electrode electrically connecting two ends of the first sensing electrode; and
a recognition pattern disposed between the two ends of the first sensing electrodes separated from each other,
wherein the connection electrode includes a first connection electrode disposed in a region where the first sensing electrode intersects the second sensing electrode, and a second connection electrode disposed between adjacent second sensing electrodes, and
wherein the recognition pattern is insulated from the first sensing electrode, the second sensing electrode, and the connection electrode.

15. The display device of claim 14,
wherein the first connection electrode overlaps the second sensing electrode, and the second connection electrode does not overlap the second sensing electrode.

16. The display device of claim 15,
wherein the touch sensing unit further includes a touch area in which touch sensing is performed, and
the first connection electrode and the second connection electrode are disposed in the touch area.

17. The display device of claim 14,
wherein the recognition pattern overlaps the second connection electrode.

18. The display device of claim 14,
wherein the first sensing electrode and the second sensing electrode has a mesh structure, and
each of the plurality of the first sensing electrodes includes touch conductive patterns separated from each other, and each of the plurality of the second sensing electrodes is integrally formed.

* * * * *